United States Patent
Park et al.

(10) Patent No.: US 8,043,927 B2
(45) Date of Patent: Oct. 25, 2011

(54) METHOD OF MANUFACTURING A CMOS IMAGE SENSOR

(75) Inventors: Byung-Jun Park, Yongin-si (KR);
Tae-Hun Lee, Pohang-si (KR);
Seung-Hun Shin, Yongin-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 192 days.

(21) Appl. No.: 12/457,773

(22) Filed: Jun. 22, 2009

(65) Prior Publication Data

US 2009/0317933 A1 Dec. 24, 2009

(30) Foreign Application Priority Data

Jun. 24, 2008 (KR) ........................ 10-2008-0059550

(51) Int. Cl.
*H01L 21/76* (2006.01)
(52) U.S. Cl. .......... 438/401; 438/60; 438/462; 438/975; 257/283; 257/797; 257/E23.179; 257/E21.525
(58) Field of Classification Search .................. 257/283, 257/797, E23.179, E21.252; 438/60, 75, 438/401, 462, 975
See application file for complete search history.

(56) References Cited

U.S. PATENT DOCUMENTS

| | | | |
|---|---|---|---|
| 5,843,831 A * | 12/1998 | Chung et al. ................... | 438/401 |
| 2006/0057815 A1* | 3/2006 | Kim .............................. | 438/401 |
| 2006/0134882 A1* | 6/2006 | Zhang ........................... | 438/424 |
| 2008/0017893 A1* | 1/2008 | Cazaux et al. ................. | 257/233 |
| 2008/0251821 A1* | 10/2008 | Ko et al. ........................ | 257/292 |

FOREIGN PATENT DOCUMENTS

| | | |
|---|---|---|
| JP | 2003-273343 | 9/2003 |
| JP | 2006-086226 | 3/2006 |
| KR | 10-2007-0034883 | 3/2007 |

* cited by examiner

*Primary Examiner* — William D Coleman
*Assistant Examiner* — Su Kim
(74) *Attorney, Agent, or Firm* — Harness, Dickey & Pierce, P.L.C.

(57) ABSTRACT

In a method of manufacturing a complementary metal-oxide semiconductor (CMOS) image sensor (CIS), an epitaxial layer may be formed on a first substrate including a chip area and a scribe lane area. A first impurity layer may be formed adjacent to the first substrate by implanting first impurities into the epitaxial layer. A photodiode may be formed in the epitaxial layer on the chip area. A circuit element electrically connected to the photodiode may be formed on the epitaxial layer. A protective layer protecting the circuit element may be formed on the epitaxial layer. A second substrate may be attached onto the protective layer. The first substrate may be removed to expose the epitaxial layer. A color filter layer may be formed on the exposed epitaxial layer using the first impurity layer as an alignment key. A microlens may be formed over the color filter layer.

13 Claims, 15 Drawing Sheets

METHOD OF MANUFACTURING A CMOS IMAGE SENSOR

PRIORITY STATEMENT

This application claims priority under U.S.C. §119 to Korean Patent Application No. 10-2008-0059550, filed on Jun. 24, 2008, in the Korean Intellectual Property Office (KIPO), the entire contents of which are incorporated herein by reference.

BACKGROUND

1. Field

Example embodiments relate to a complementary metal-oxide semiconductor (CMOS) image sensor (CIS) and a method of manufacturing the same. More particularly, example embodiments relate to a CIS having a backside illumination (BSI) architecture and a method of manufacturing the same.

2. Description of the Related Art

Image sensors convert optical signals to electrical signals. As the information and communication industry are becoming more developed and electronic equipment is becoming digitized, image sensors may be used in many devices, e.g., digital cameras, camcorders, mobile phones, personal communication system (PCS) phones, game consoles, and/or medical micro video cameras.

In order to increase the resolution of images, pixels of an image sensor may be highly integrated. However, as the pixels become highly integrated, the area of a photoelectronic conversion device, e.g., a photodiode per unit pixel, becomes smaller, thereby decreasing sensitivity.

Generally, if sensitivity becomes small according to the reduction of the photodiode area, the sensitivity may be increased by increasing an amount of light incident on the photodiode. In a typical complementary metal-oxide semiconductor (CMOS) image sensor (CIS), light may be incident on a front surface of an image sensor cell and may penetrate the image sensor. While the incident light penetrates the image sensor cell, e.g., a thick insulation layer, a large amount thereof, especially, a large amount of red color light having a long wavelength, may be absorbed by the insulation layer, thereby decreasing light efficiency.

Thus, backside illumination (BSI) technology has been introduced to solve the problem. In a method of manufacturing a CIS having a BSI architecture, metal wirings of circuits may be formed on a front surface of a substrate, and color filter layers and microlenses may be formed on a rear surface thereof. However, when the color filter layers and the microlenses are formed on the rear surface, alignment keys that may be used for forming the metal wirings may not be easy to recognize, and thus, the color filter layers and the microlenses may not be well aligned with the metal wirings.

SUMMARY

Example embodiments provide a method of manufacturing a complementary metal-oxide semiconductor (CMOS) image sensor (CIS) having a backside illumination (BSI) architecture in which alignment among devices thereof may be easily performed. Example embodiments provide a CIS having a BSI architecture in which devices may be well aligned.

According to example embodiments, there may be provided a method of manufacturing a CIS. In the method, an epitaxial layer may be formed on a first substrate including a chip area and a scribe lane area. A first impurity layer may be formed adjacent to the first substrate by implanting first impurities into the epitaxial layer. A photodiode may be formed in the epitaxial layer on the chip area. A circuit element electrically connected to the photodiode may be formed on the epitaxial layer. A protective layer protecting the circuit element may be formed on the epitaxial layer. A second substrate may be attached onto the protective layer. The first substrate may be removed to expose the epitaxial layer. A color filter layer may be formed on the exposed epitaxial layer using the first impurity layer as an alignment key. A microlens may be formed over the color filter layer.

In example embodiments, removing the first substrate to expose the epitaxial layer may include exposing the first impurity layer. A portion of the first impurity layer may be removed when the first substrate is removed. The epitaxial layer may be lightly doped with impurities, and the first impurity layer may be heavily doped with impurities. After forming the first impurity layer, the method may further include forming a second impurity layer on the first impurity layer by implanting second impurities into the epitaxial layer, wherein the second impurity layer and the first impurity layer may be used as an alignment key for the photodiode and the circuit element.

In example embodiments, forming the first impurity layer may include forming a first isolation trench in the chip area of the epitaxial layer; and forming an ion implantation region in the epitaxial layer by implanting ions into a portion of the epitaxial layer exposed by the first isolation trench. The method may further include forming a second isolation trench in the scribe lane area of the epitaxial layer, wherein the first isolation trench is formed to have a depth deeper than that of the second isolation trench and a thickness greater than the thickness of the photodiode. The ions may include oxygen ions or nitrogen ions. The epitaxial layer may be formed to a thickness of about 5 to about 15 μm.

In example embodiments, forming the epitaxial layer may further include forming first, second and third n-wells and first and second p-wells in the epitaxial layer on the chip area, wherein the first n-well is adjacent to or contacting the first substrate. The method may further include forming a gate insulation layer on the epitaxial layer, forming a plurality of gate electrodes on the gate insulation layer, forming source/drain regions adjacent to the plurality of gate electrodes in the epitaxial layer, forming an insulating interlayer on the gate insulation layer configured to cover the plurality of gate electrodes, and forming a plurality of metal wirings through or on the insulating interlayer, wherein the plurality of metal wirings are electrically connected to the source/drain regions.

According to example embodiments, a complementary metal-oxide semiconductor (CMOS) image sensor (CIS) may include a circuit element, an epitaxial layer on the circuit element, the epitaxial layer including a photodiode electrically connected to the circuit element, and a first impurity layer used as an alignment key for the photodiode and a color filter layer, the color filter layer on the epitaxial layer, and a microlens on the color filter layer.

In example embodiments, the first impurity layer may be formed at an upper portion of the epitaxial layer. The epitaxial layer may be lightly doped with impurities, and the first impurity layer may be heavily doped with impurities. The epitaxial layer may include lightly doped p-type impurities and may be formed to a thickness of about 5 to about 15 μm. The epitaxial layer may further include first, second and third n-wells and first and second p-wells, wherein the first n-well may be adjacent to or contacting a first substrate including a chip area and a scribe lane area.

In example embodiments, the epitaxial layer may further include a first isolation trench in the chip area and having a height greater than the thickness of the photodiode, and a second isolation trench in the scribe lane area having a depth shallower than that of the first isolation trench. The CIS may further include a second impurity layer on the first impurity layer, wherein the second impurity layer and the first impurity layer form an alignment key.

In example embodiments, the CIS may include a circuit element on the epitaxial layer, the circuit element being electrically connected to the photodiode, a protective layer on the epitaxial layer, the protective layer protecting the circuit element, and a second substrate on the protective layer. The CIS may further include a gate insulation layer on the epitaxial layer, a plurality of gate electrodes on the gate insulation layer, source/drain regions adjacent to the plurality of gate electrodes in the epitaxial layer, an insulating interlayer on the gate insulation layer configured to cover the plurality of gate electrodes, and a plurality of metal wirings through or on the insulating interlayer, wherein the plurality of metal wirings are electrically connected to the source/drain regions.

According to example embodiments, in a method of manufacturing a CIS having a BSI architecture, alignment among elements may be easily performed. Thus, the CIS may have improved sensitivity and improved electrical characteristics.

BRIEF DESCRIPTION OF THE DRAWINGS

Example embodiments will be more clearly understood from the following detailed description taken in conjunction with the accompanying drawings.

FIGS. 1 to 11 are cross-sectional views illustrating a method of manufacturing a complementary metal-oxide semiconductor (CMOS) image sensor (CIS) in accordance with example embodiments;

FIGS. 12 to 19 are cross-sectional views illustrating a method of manufacturing a CIS in accordance with example embodiments;

FIG. 20 is a block diagram illustrating a system having a CIS in accordance with example embodiments;

FIG. 21 is a block diagram illustrating a CIS chip in accordance with example embodiments;

FIG. 22 illustrates a camera phone including a CIS chip in accordance with example embodiments; and FIG. 23 illustrates a digital camera including a CIS chip in accordance with example embodiments.

Figure 1:
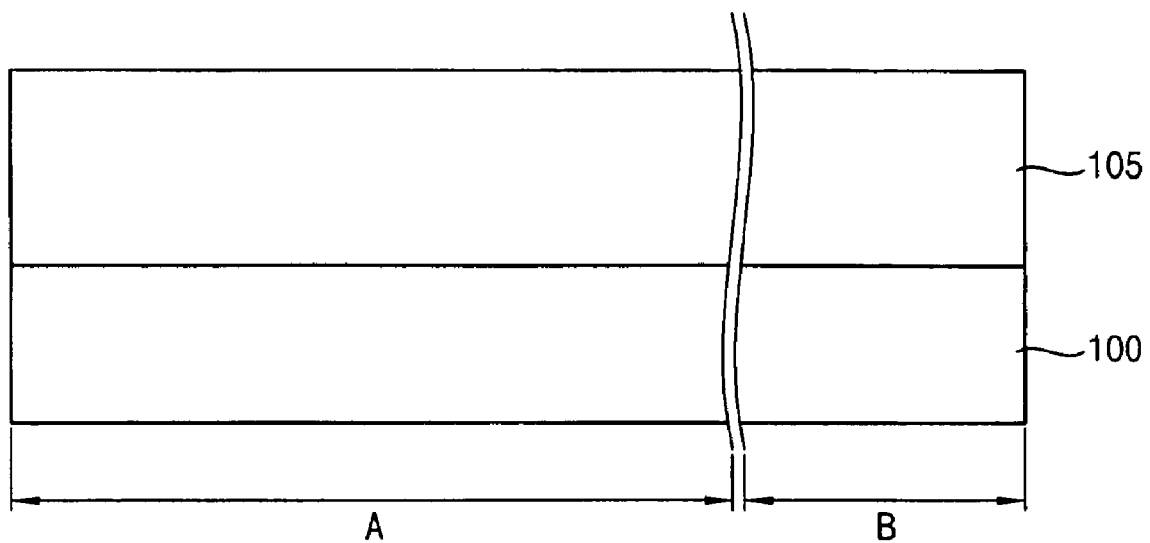
FIGS. 1 to 23 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

FIGS. 1 to 11 are cross-sectional views illustrating a method of manufacturing a CIS in accordance with example embodiments. Referring to FIG. 1, a first substrate 100 may include a chip area A on which active pixel sensor (APS) arrays, common devices and circuit elements may be formed and a scribe lane area B. The first substrate 100 may include a p-type substrate or an n-type substrate. A complementary metal-oxide semiconductor (CMOS) image sensor (CIS) having a p-type substrate may have improved sensitivity, but undesirable dark current and crosstalk characteristics. On the other hand, a CIS having an n-type substrate may have improved dark current characteristics or improved crosstalk characteristics, but undesirable sensitivity.

In consideration of these characteristics, either a p-type or an n-type substrate may be used. In example embodiments, the first substrate 100 may include a p-type substrate. An epitaxial layer 105 may be formed on the first substrate 100. The epitaxial layer 105 may be lightly doped with impurities. In example embodiments, the epitaxial layer 105 may include lightly doped p-type impurities. In example embodiments, the epitaxial layer 105 may be formed to a thickness of about 5 to about 15 μm.

Figure 2:
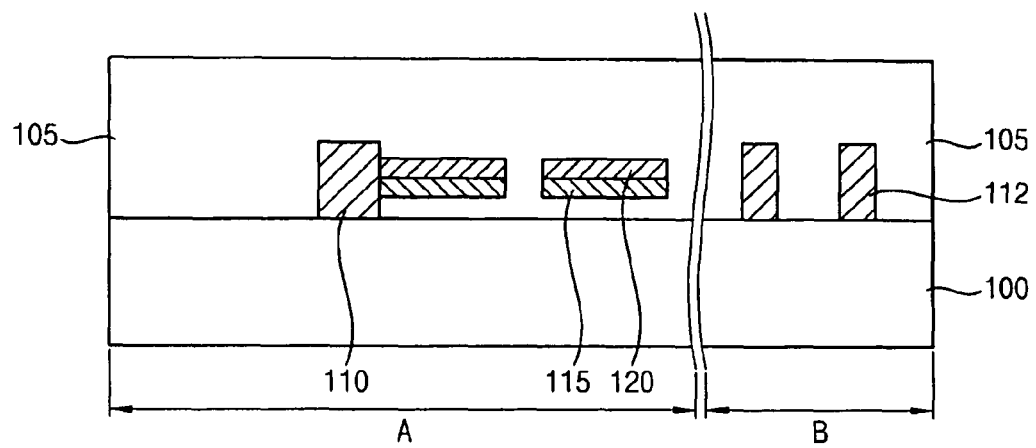

Referring to FIG. 2, a first n-well 110, a second n-well 115 and a first p-well 120 may be formed in the epitaxial layer 105 on the chip area A. The first n-well 110 may be formed to be adjacent to the first substrate 100. In example embodiments, the first n-well 110 may be formed to contact with the first substrate 100. The first n-well 110 may define a guard ring region of the APS arrays. The first p-well 120 and the second n-well 115 may be used for forming the circuit elements and the common devices. The first p-well 120 may be formed on the second n-well 115.

The second n-well 115 may be formed by implanting n-type impurities, e.g., phosphorus, into the epitaxial layer 105. The n-type impurities may be implanted at a dose of about $4\times10^{13}$ with an energy of about 1.4 MeV. The first p-well 120 may be formed by implanting p-type impurities, e.g., boron, into the epitaxial layer 105. The p-type impurities may be implanted at a dose of about $2\times10^{13}$ with an energy of about 1.4 MeV. The first n-well 110 may be formed by implanting n-type impurities, e.g., phosphorus, into the epitaxial layer 105. The n-type impurities may be implanted at a dose of about $2\times10^{13}$ with an energy of about 2.0 MeV.

A first impurity layer 112 may be formed in the epitaxial layer 105 on the scribe lane area B. The first impurity layer 112 may be formed by implanting n-type or p-type impurities at a high concentration in the epitaxial layer 105. The first impurity layer 112 may be formed to be adjacent to the first substrate 100. In example embodiments, the first impurity layer 112 may be formed to contact the first substrate 100.

In example embodiments, when the first n-well 110 is formed on the chip area A, the first impurity layer 112 may be formed on the scribe lane area B with the same impurities. The first impurity layer 112 may have a high impurity concentration, which may be differentiated from that of the epitaxial layer 105.

Figure 3:
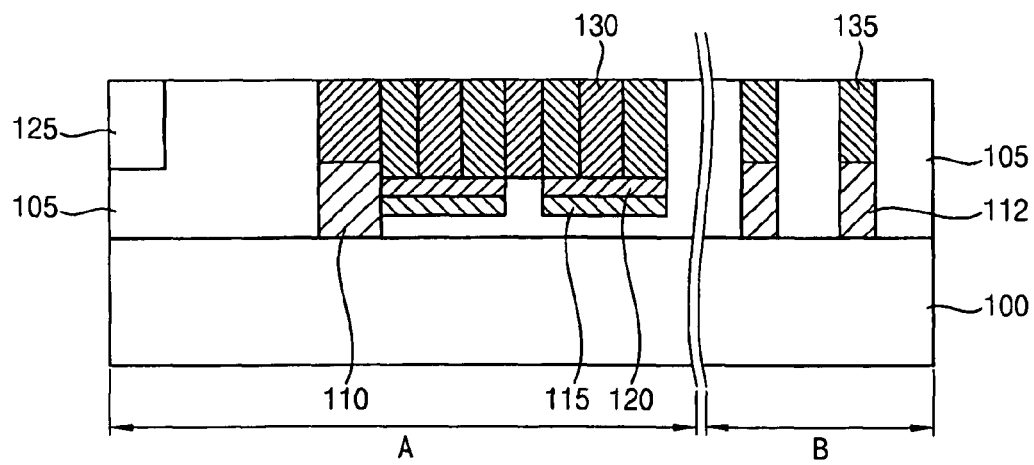

Referring to FIG. 3, a second p-well 125 and a third n-well 130 may be formed in the epitaxial layer 105 on the chip area A. The second p-well 125 may be formed on an upper portion of the epitaxial layer 105. The third n-well 130 may be formed on a top surface of the first p-well 120. The second p-well 125 and the third n-well 130 may be used for forming the circuit elements and the common devices.

A second impurity layer 135 may be formed in the epitaxial layer 105 on the scribe lane area B. The second impurity layer 135 may serve as an alignment key for subsequently formed devices, e.g., photodiodes and/or metal wirings. In an example, the second impurity layer 135 may be formed on the first impurity layer 112, and thus, the first and second impurity layers 112 and 135 together may serve as the alignment key. The second impurity layer 135 may also be formed on a top surface of the first p-well 120.

Figure 4:
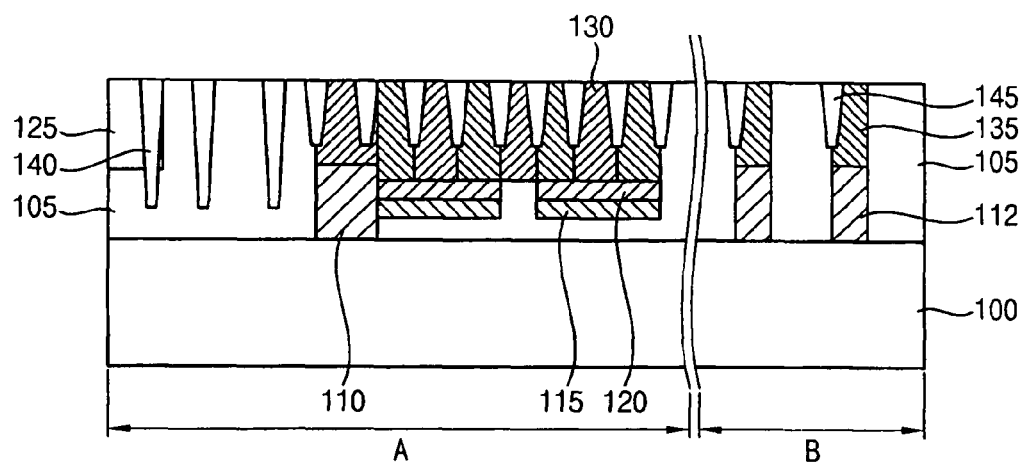

Referring to FIG. 4, a first isolation layer 140 and a second isolation layer 145 may be formed in the epitaxial layer 105. The first isolation layer 140 may isolate photodiodes 150 (see FIG. 5) therebetween, and the second isolation layer 145 may isolate common devices and circuit elements therebetween. The first isolation layer 140 may be formed to have a depth deeper than that of the second isolation layer 145. Alternatively, the first isolation layer 140 may be formed to have a depth substantially the same as that the second isolation layer 145.

When light may be incident onto the epitaxial layer 105, the photodiode 150 may sense the light. The light may include blue color light, green color light and red color light, and the red color light having the longest wavelength thereamong may have a wavelength of about 0.4 to about 5 μm. Thus, the photodiode 150 may have a thickness greater than about 2 μm.

Figure 5:
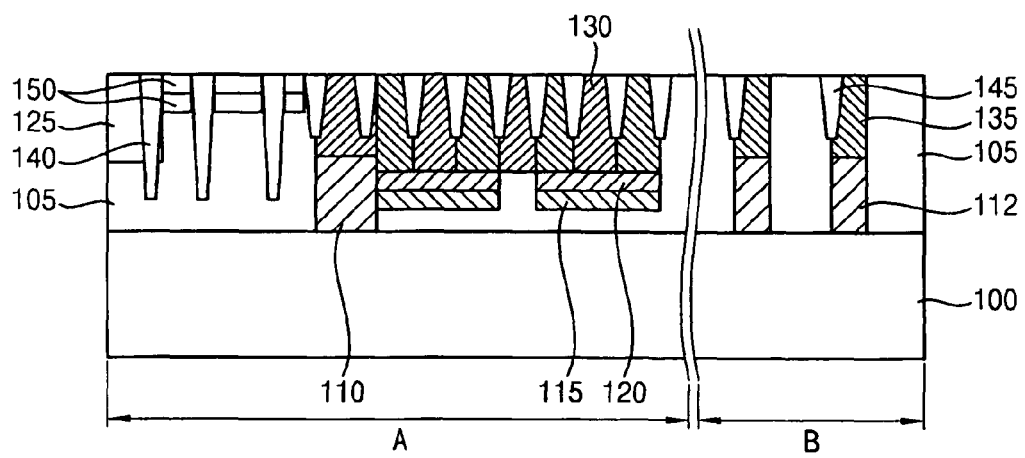

The first isolation layer 140 may have a depth greater than the thickness of the photodiode 150, so that a crosstalk phenomenon between adjacent pixels may be prevented or reduced. However, in order to realize a high degree of integration, the second isolation layer 145 may have a depth smaller than that of the first isolation layer 140, e.g., less than about 2 μm. Referring to FIG. 5, the photodiode 150 may be formed in a region in which the APS arrays may be formed in the epitaxial layer 105. The photodiode 150 may be formed by sequentially implanting n-type impurities and p-type impurities in the epitaxial layer 105.

Figure 6:
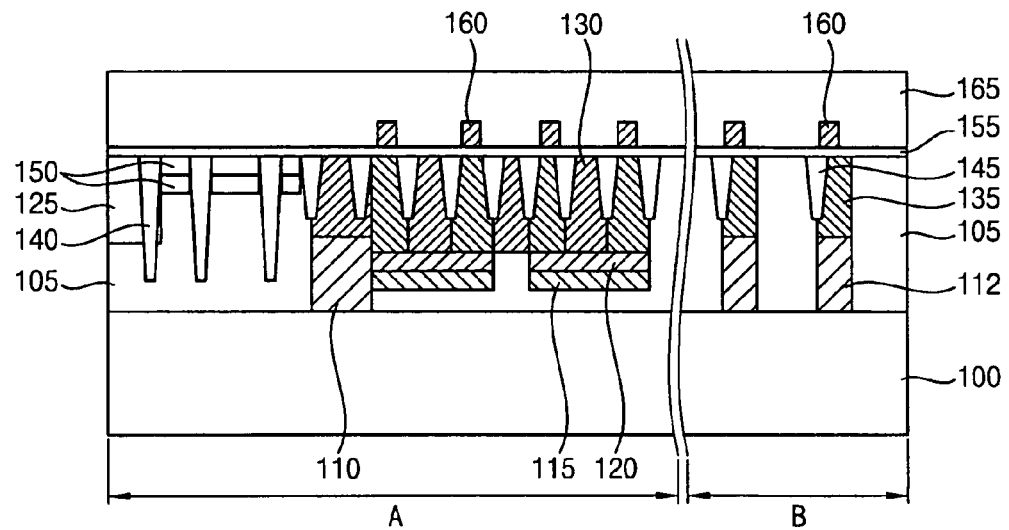
Figure 7:
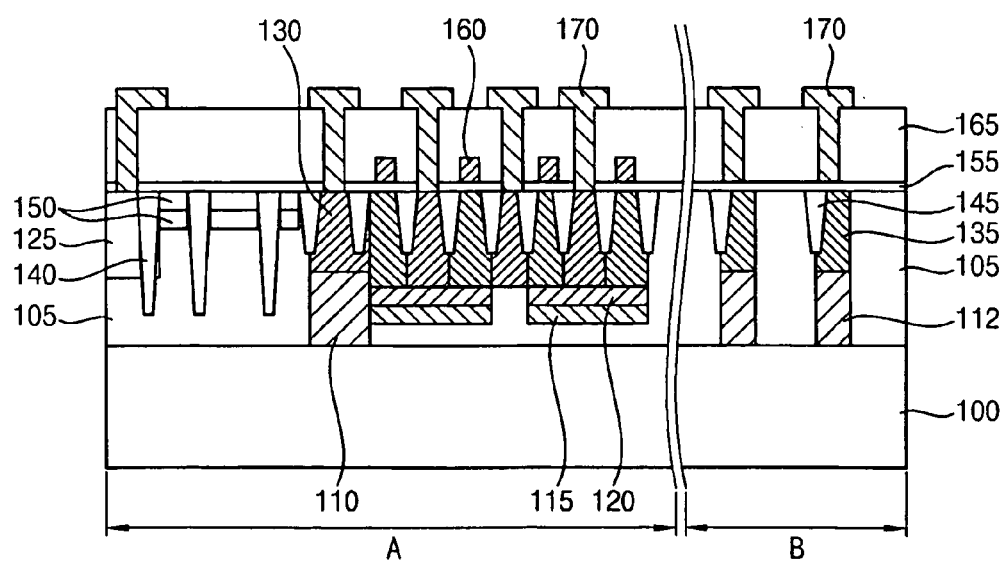

Referring to FIG. 6, a gate insulation layer 155 may be formed on the epitaxial layer 105. A plurality of gate electrodes 160 may be formed on the gate insulation layer 155, and source/drain regions (not shown) may be formed adjacent to the gate electrodes 160 in the epitaxial layer 105. An insulating interlayer 165 may be formed on the gate insulation layer 155 to cover the gate electrodes 160. Referring to FIG. 7, a plurality of metal wirings 170 may be formed through or on the insulating interlayer 165. The metal wirings 170 may be electrically connected to the source/drain regions, and form the circuits.

Figure 8:
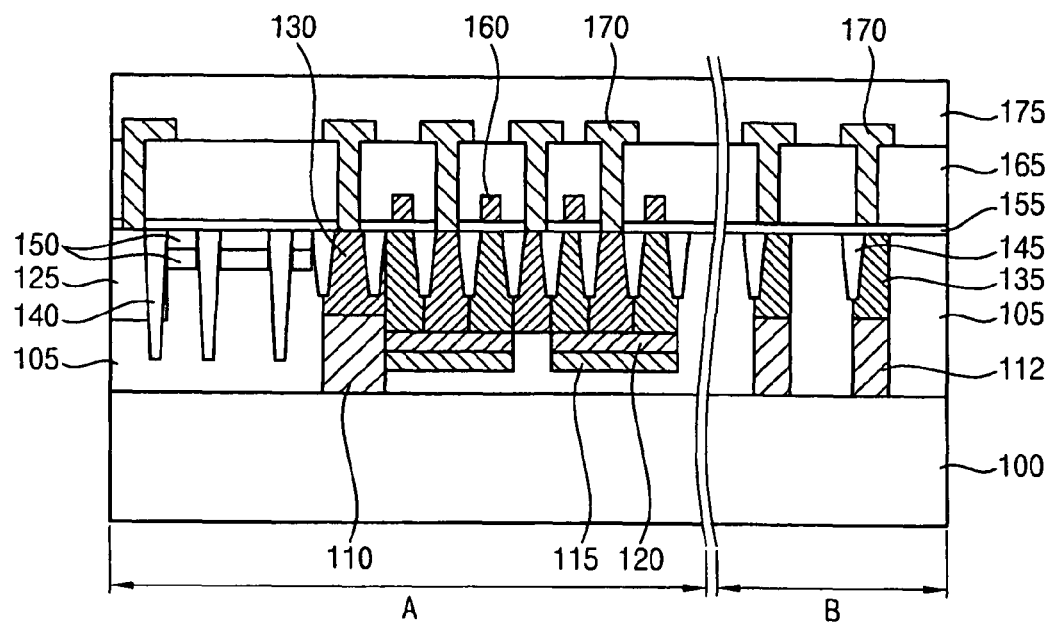

Referring to FIG. 8, a protective layer 175 may be formed on the insulating interlayer 165 to cover the metal wirings 170. Some other metal wirings (not shown) may be further formed through or on the protective layer 175, and in example embodiments, other protective layers may be further formed.

Figure 9:
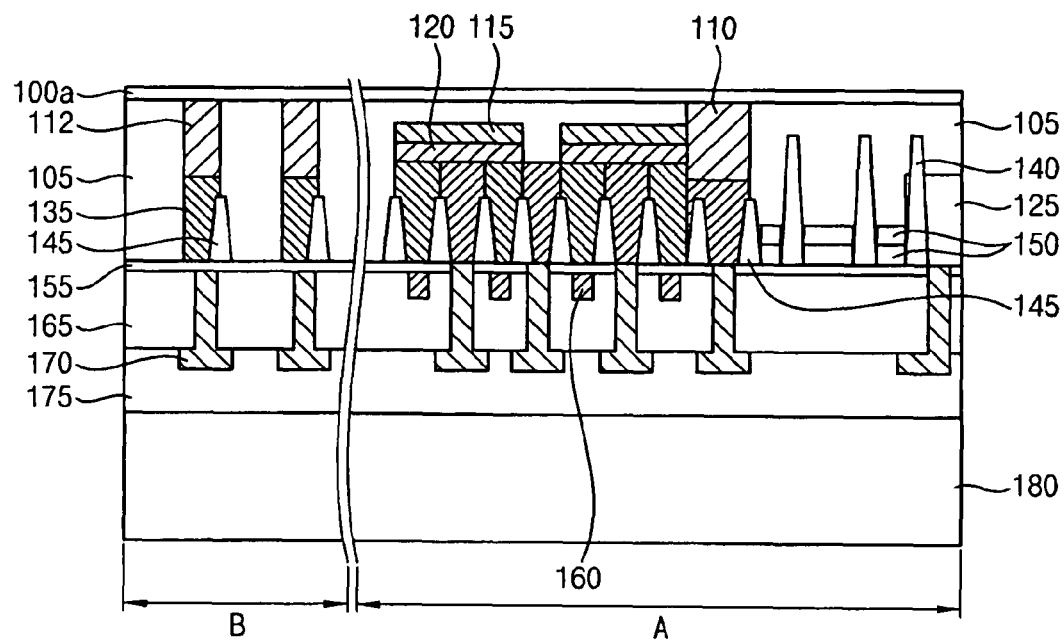

Referring to FIG. 9, an upper portion of the protective layer 175 may be planarized, and a second substrate 180 may be attached onto the protective layer 175. For convenience of manufacturing, the resultant structure may be overturned. Most of the first substrate 100 may be removed by a thinning process. Thus, a remaining portion 100a of the first substrate 100 is shown in FIG. 9.

Figure 10:
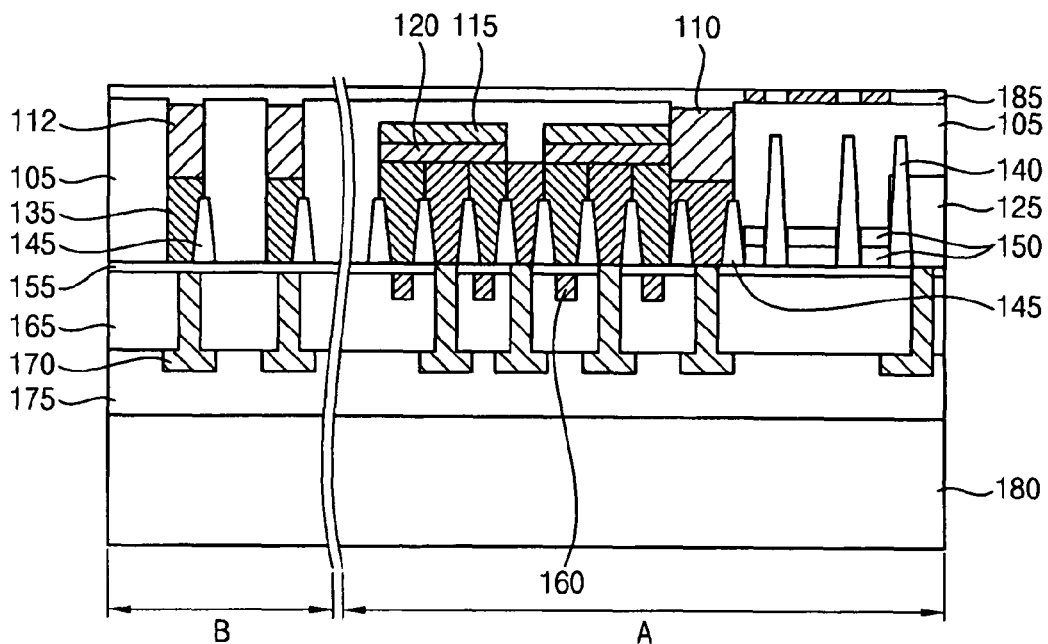

Referring to FIG. 10, the remaining portion 100a of the first substrate 100 may be removed by a wet etching process. When the remaining portion 100a of the first substrate 100 is removed, a portion of the epitaxial layer 105 may be removed. In example embodiments, a portion of the first impurity layer 112 may be exposed by the wet etching process, and removed. The impurity concentration of the first impurity layer 112 may be different from that of the epitaxial layer 105, and thus, the etch rate of the first impurity layer 112 may be different from that of the epitaxial layer 105. Thus, a step difference between the first impurity layer 112 and the epitaxial layer 105 may be formed. The exposed portion of the first impurity layer 112 or the step difference may serve as an alignment key for subsequently formed devices, e.g., a color filter layer 185 or a microlens 195 (see FIG. 11). When the portion of the first impurity layer 112 is removed, a portion of the first n-well 110 may also be removed. In example embodiments, the first impurity layer 112 may be neither exposed nor removed by the wet etching process. However, the first impurity layer 112 has been formed adjacent to the first substrate 100, even though not exposed, and the first impurity layer 112 may be easily recognized.

The first impurity layer 112 together with the second impurity layer 135 may serve as the alignment key for the photodiodes 150 and the metal wirings 170, and simultaneously the first impurity layer 112 may serve as the alignment key for the color filter layer 185 and the microlens 195. Thus, the above devices in the CIS in accordance with example embodiments may be aligned with each other. The color filter layer 185 may be formed on the epitaxial layer 105. The color filter layer 185 may include a plurality of color filter arrays.

Figure 11:
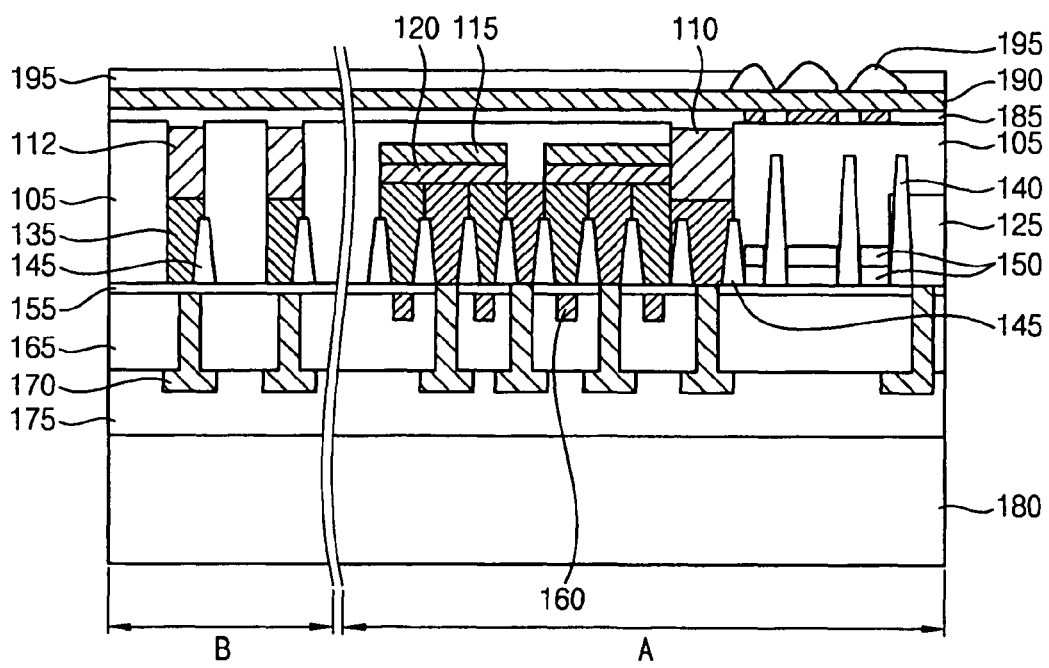

Referring to FIG. 11, after a planarization layer 190 may be formed on the color filter layer 185, the microlens 195 may be formed on the planarization layer 190. When light penetrates through the microlens 195, specific color light may be selected by the color filter arrays, and the light having penetrated through the color filter arrays may be incident on the photodiodes 150.

As described above, the first isolation layer 140 having the depth (height) greater than the thickness of the photodiode 150 may be formed in the epitaxial layer 105 so that a crosstalk phenomenon may be prevented or reduced. According to example embodiments, the first impurity layer 112 serving as the alignment key for the photodiodes 150 and the metal wirings 170 may serve as the alignment key for the color filter layer 185 and the microlens 195. Thus, the CIS may have improved alignment characteristics.

Figure 12:
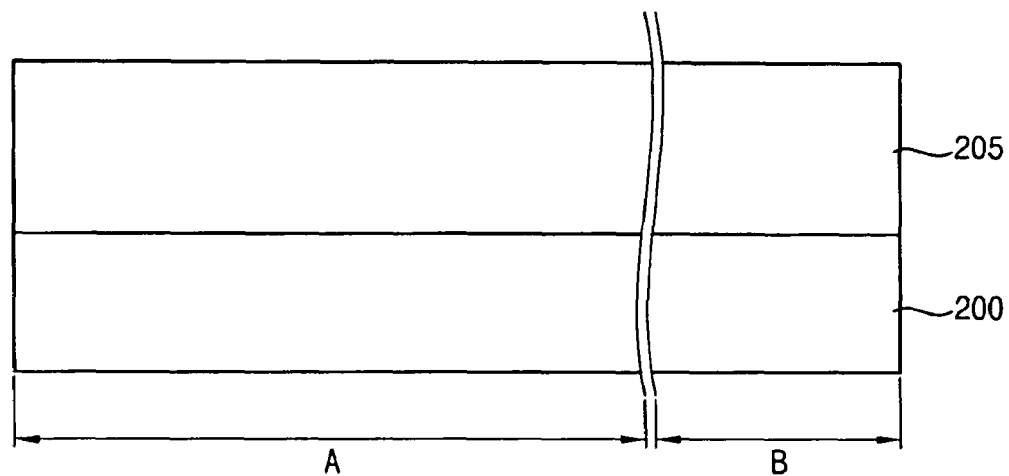

FIGS. 12 to 19 are cross-sectional views illustrating a method of manufacturing a CIS in accordance with example embodiments. Referring to FIG. 12, a first substrate 200 may include a chip area A on which APS arrays, common devices and circuit elements may be formed and a scribe lane area B. The first substrate 200 may include a p-type substrate or an n-type substrate. In example embodiments, the first substrate 200 may include a p-type substrate.

An epitaxial layer 205 may be formed on the first substrate 200. The epitaxial layer 205 may be lightly doped with impurities. In example embodiments, the epitaxial layer 205 may be lightly doped with p-type impurities. In example embodiments, the epitaxial layer 205 may be formed to a thickness of about 5 to about 15 μm.

Figure 13:
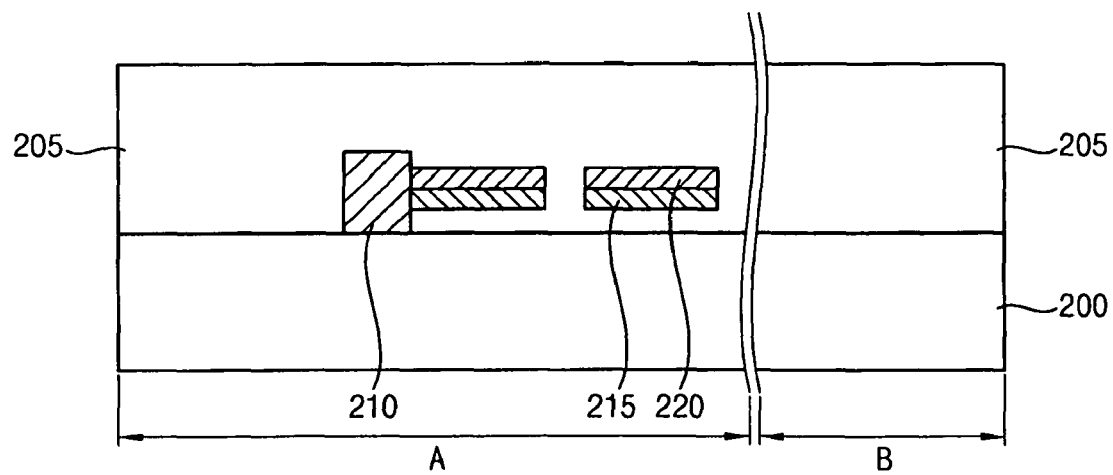

Referring to FIG. 13, a first n-well 210, a second n-well 215 and a first p-well 220 may be formed in the epitaxial layer 205 on the chip area A. The first n-well 210 may be formed to be adjacent to the first substrate 200. In example embodiments, the first n-well 210 may be formed to contact with the first substrate 200. The first n-well 210 may define a guard ring region of the APS arrays. The first p-well 220 and the second n-well 215 may be used for forming the circuit elements and the common devices. The first p-well 220 may be formed on the second n-well 215.

The second n-well 215 may be formed by implanting n-type impurities, e.g., phosphorus, into the epitaxial layer 205. The n-type impurities may be implanted at a dose of about $4 \times 10^{13}$ with an energy of about 1.4 MeV. The first p-well 220 may be formed by implanting p-type impurities, e.g., boron, into the epitaxial layer 205. The p-type impurities may be implanted at a dose of about $2 \times 10^{13}$ with an energy of about 1.4 MeV.

The first n-well 210 may be formed by implanting n-type impurities, e.g., phosphorus, into the epitaxial layer 205. The n-type impurities may be implanted at a dose of about $2 \times 10^{13}$ with an energy of about 2.0 MeV. An impurity layer (not shown), e.g., the first impurity layer 112 in FIG. 2 may be further formed in the epitaxial layer 205 on the scribe lane area B.

Figure 14:
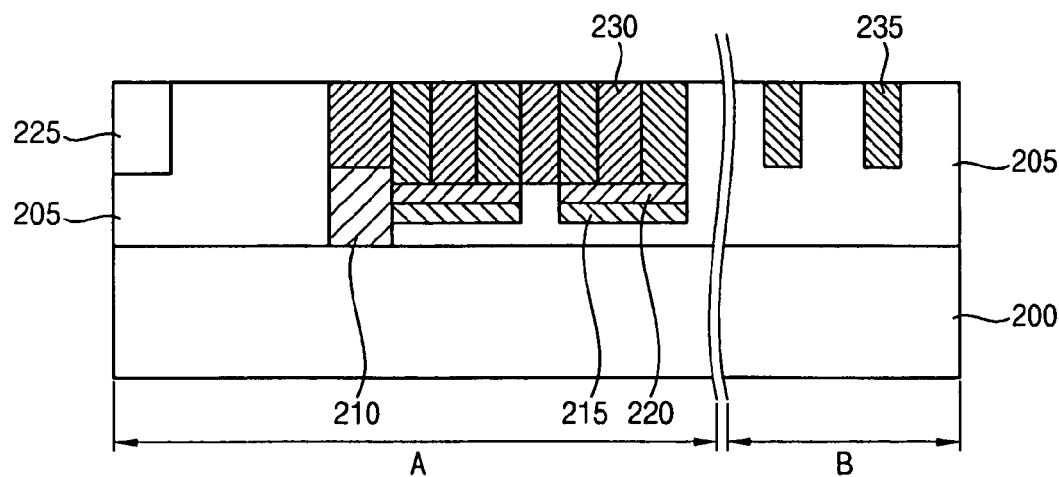

Referring to FIG. 14, a second p-well 225 and a third n-well 230 may be formed in the epitaxial layer 205 on the chip area A. The second p-well 225 may be formed at an upper portion of the epitaxial layer 205. The third n-well 230 may be formed on a top surface of the first p-well 220. The second p-well 225 and the third n-well 230 may be used for forming the circuit elements and the common devices.

A second impurity layer 235 may be formed in the epitaxial layer 205 on the scribe lane area B. The second impurity layer 235 may serve as an alignment key for subsequently formed devices, e.g., photodiodes and/or metal wirings. The second impurity layer 235 may also be formed on a top surface of the first p-well.

Figure 15:
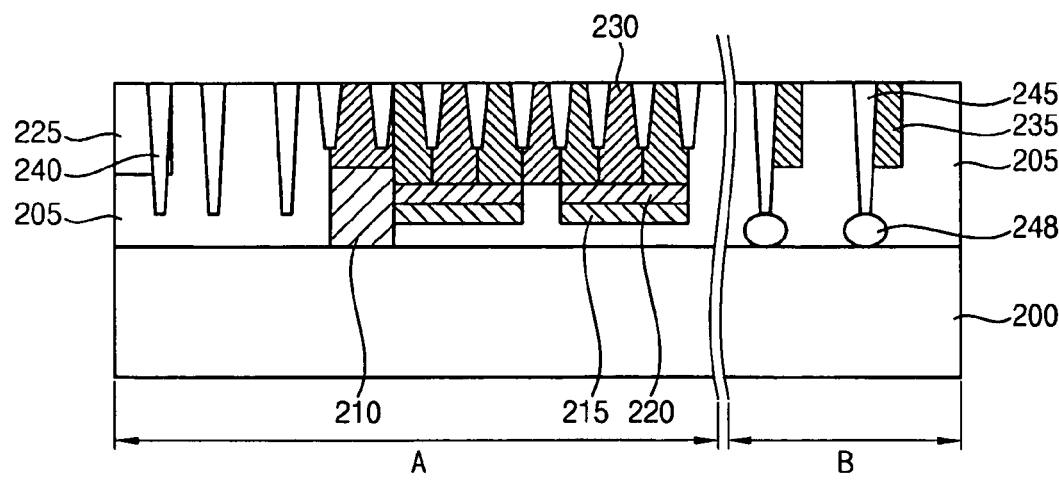

Referring to FIG. 15, a first isolation layer 240 and a second isolation layer 245 may be formed in the epitaxial layer 205. The first isolation layer 240 may isolate photodiodes 250 (see FIG. 16) therebetween, and the second isolation layer 245 may isolate common devices and circuit elements therebetween. The first isolation layer 240 may be formed to have a depth deeper than that of the second isolation layer 245.

The first isolation layer 240 may be formed in the epitaxial layer 205 not only on the chip area A but also on the scribe lane area B. On the scribe lane area B, an isolation trench may be formed in the epitaxial layer 205. Ions, e.g., oxygen ions or nitrogen ions, may be implanted onto a lower portion of the epitaxial layer 205 that may be exposed by the isolation trench, so that an ion implantation region 248 may be formed. In a subsequently performed heat treatment process, the oxygen ion or the nitrogen ion may be coupled with silicon of the epitaxial layer 205 or the first substrate 200, so that a silicon oxide layer or a silicon nitride layer may be formed. The ion implantation region 248 may serve as an alignment key for color filter layer 285 and a microlens 295 (see FIG. 19). For example, the ion implantation region 248 may perform substantially the same function as that of the first impurity layer 112 in FIG. 2.

Figure 16:
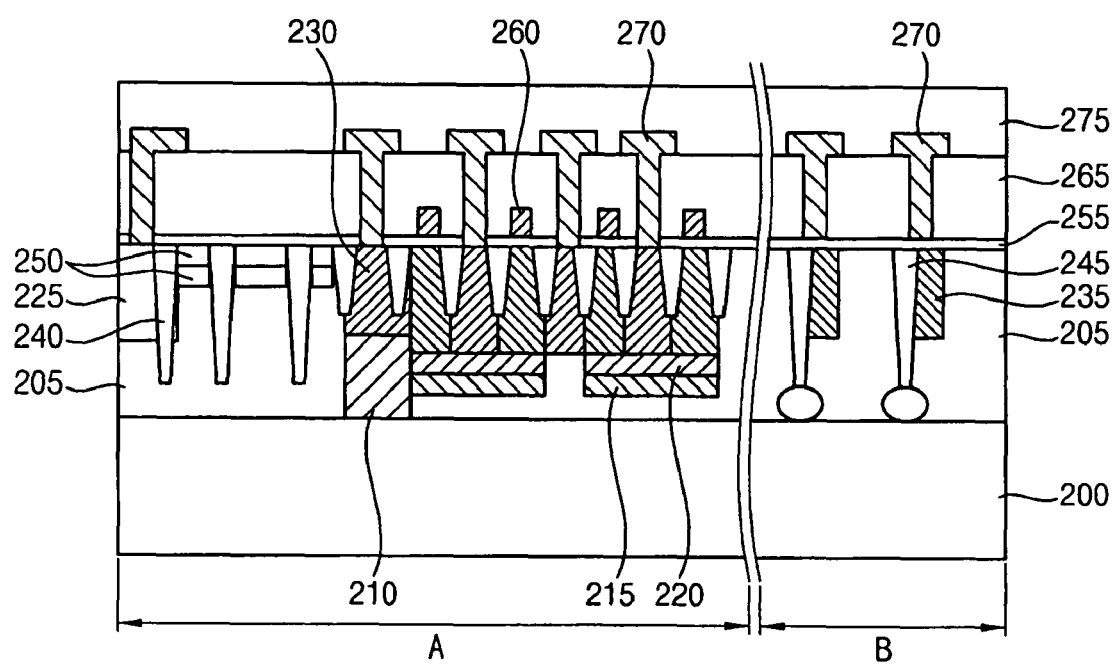

Referring to FIG. 16, processes substantially the same as or similar to those illustrated with FIGS. 5 to 8 may be performed. Thus, the photodiode 250 may be formed in a region in which the APS arrays may be formed in the epitaxial layer 205. A gate insulation layer 255 may be formed on the epitaxial layer 205. A plurality of gate electrodes 260 may be formed on the gate insulation layer 255, and source/drain regions (not shown) may be formed adjacent to the gate electrodes 260 in the epitaxial layer 205. An insulating interlayer 265 may be formed on the gate insulation layer 255 to cover the gate electrodes 260. A plurality of metal wirings 270 may be formed through or on the insulating interlayer 265. A protective layer 275 may be formed on the insulating interlayer 265 to cover the metal wirings 270.

Figure 17:
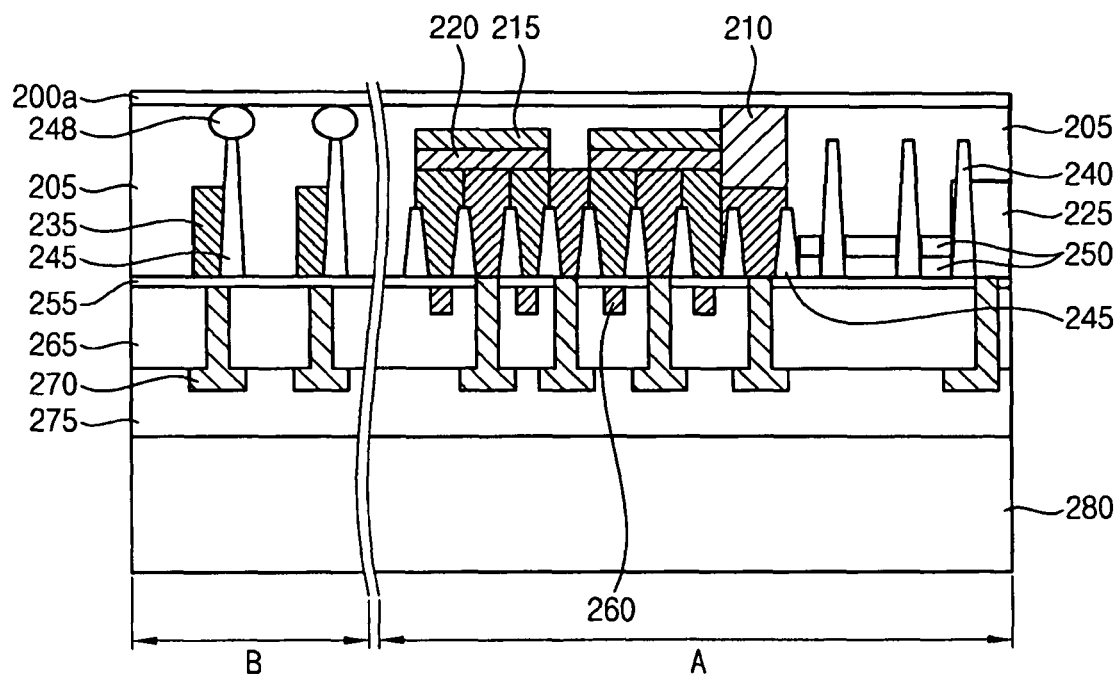

Referring to FIG. 17, an upper portion of the protective layer 275 may be planarized, and a second substrate 280 may be attached onto the protective layer 275. For convenience of manufacturing, the resultant structure may be overturned. Most of the first substrate 200 may be removed by a thinning process. Thus, a remaining portion 200a of the first substrate 200 may be shown in FIG. 17.

Figure 18:
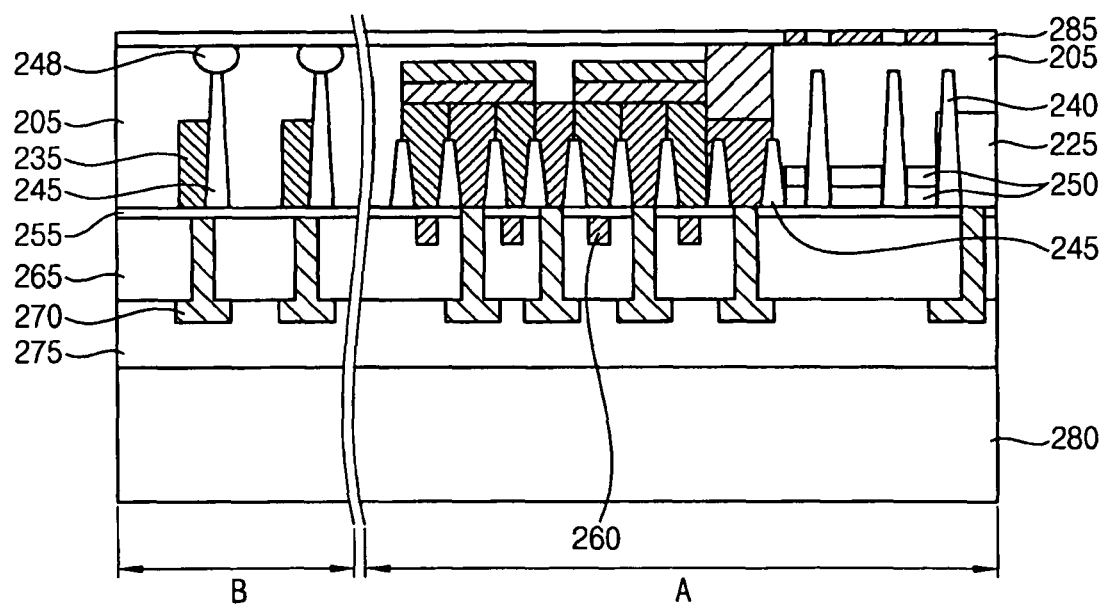

Referring to FIG. 18, the remaining portion 200a of the first substrate 200 may be removed by a wet etching process. When the remaining portion 200a of the first substrate 200 may be removed, a portion of the epitaxial layer 205 may be removed. In example embodiments, a portion of the ion implantation region 248 may be exposed by the wet etching process, and removed. The material of the ion implantation region 248 may be different from that of the epitaxial layer 205. Thus, the exposed portion of the ion implantation region 248 may serve as an alignment key for subsequently formed devices, e.g., a color filter layer 285 or a microlens 295 (see FIG. 19). The color filter layer 285 may be formed on the epitaxial layer 205. The color filter layer 285 may include a plurality of color filter arrays.

Figure 19:
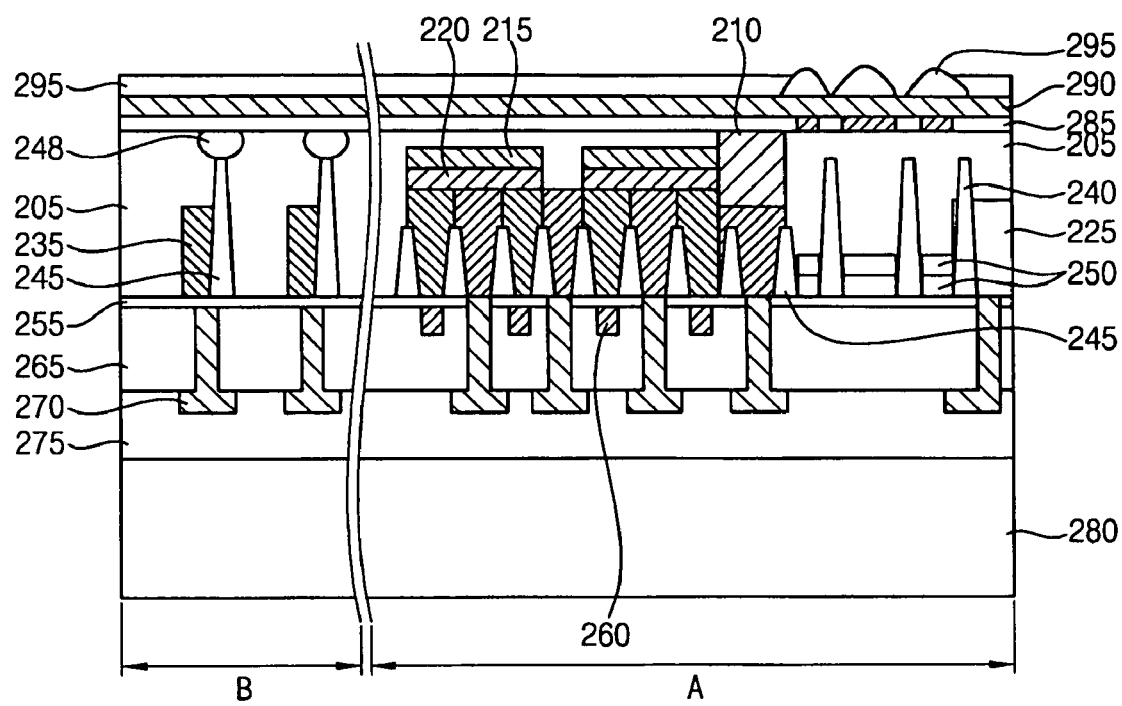

Referring to FIG. 19, after a planarization layer 290 is formed on the color filter layer 285, the microlens 295 may be formed on the planarization layer 290. As described above, the first isolation layer 240 having the depth (height) greater than the thickness of the photodiode 250 may be formed in the epitaxial layer 205 so that a crosstalk phenomenon may be prevented or reduced.

The scope of example embodiments may be not restricted to the method of manufacturing a CIS. If some devices are manufactured by stacking layers on a substrate in one direction, removing the substrate to expose a portion of the layers, and stacking other layers on the exposed portion of the layers in the other direction, the method illustrated above may be applied. For example, an impurity layer formed adjacent to the substrate in initial processes may be exposed and may serve as an alignment key for layers or elements formed in subsequent processes.

Figure 20:
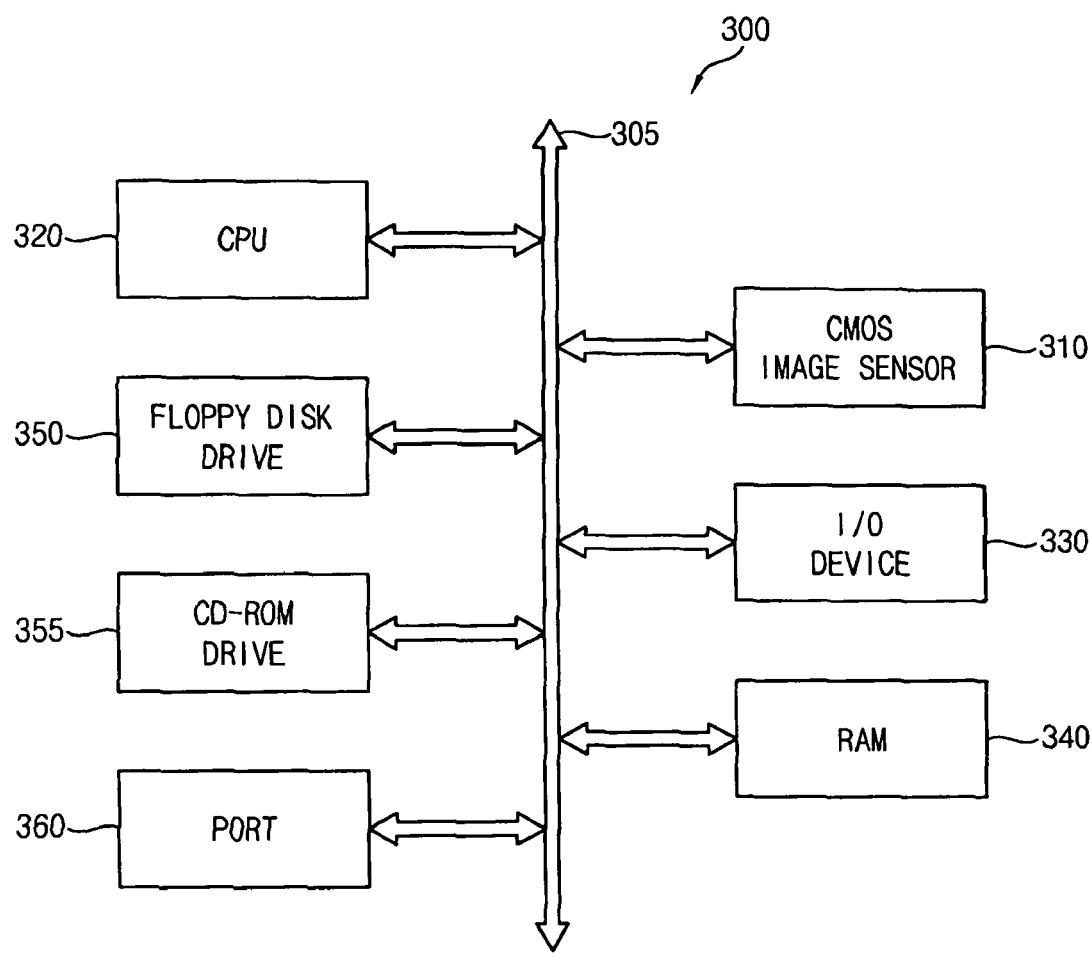

FIG. 20 is a block diagram illustrating a system having a CIS in accordance with example embodiments. Referring to FIG. 20, a system 300 may handle output images of a CIS 310. The system 300 may include a computer system, a camera system, a scanner, and/or an image security system.

The system 300 may include a central processing unit (CPU) 320 that may communicate with an input/output (I/O) device 330 via a bus 305. The CPU 320 may be electrically connected to a floppy disk drive 350, a CD-ROM drive 355, a port 360 and a random access memory (RAM) 340 through the bus 305, and data may be transferred to each other. Thus, the CIS output image may be produced. The port 360 may be coupled with a video card, a sound card, a memory card, and/or a USB device, or communicate with other systems. The CIS 310 may be mounted on a chip together with the CPU 320, a digital signal processing (DSP) device, or a memory device.

Figure 21:
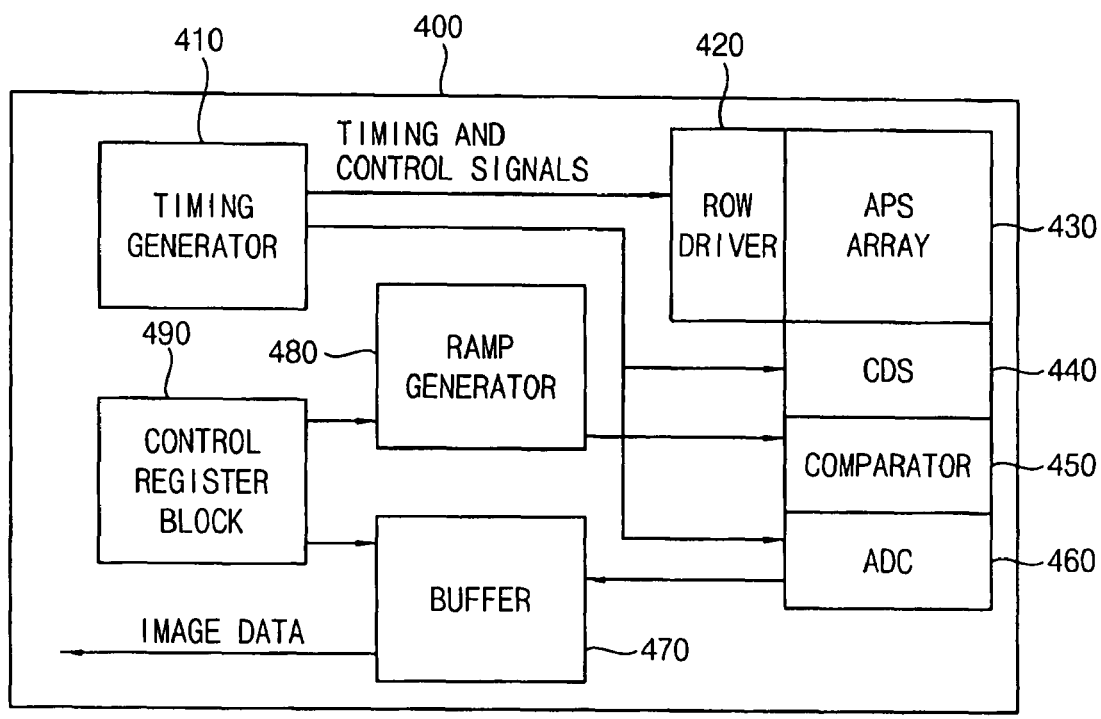

FIG. 21 is a block diagram illustrating a CIS chip in accordance with example embodiments. Referring to FIG. 21, a CIS chip 400 may include a timing generator 410, a row driver 420, an APS array 430, a correlated double sampler (CDS) 440, a comparator 450, an analog-to-digital converter (ADC) 460, a buffer 470, a ramp generator 480 and a control register block 490.

The timing generator 410 provides the row driver 420 with timing and control signals. Light data of an object collected by an optical lens of the APS array 430 is converted to electrons. The converted electrons may be converted to voltage signals. In the voltage signals, noises may be removed and some signals may be selected in the CDS 440. The selected signals may be compared in the comparator 450, and analog signals may be converted to digital signals in the ADC 460. The digitized signals flow through the buffer 470, and an image data of the object may be produced.

Figure 22:
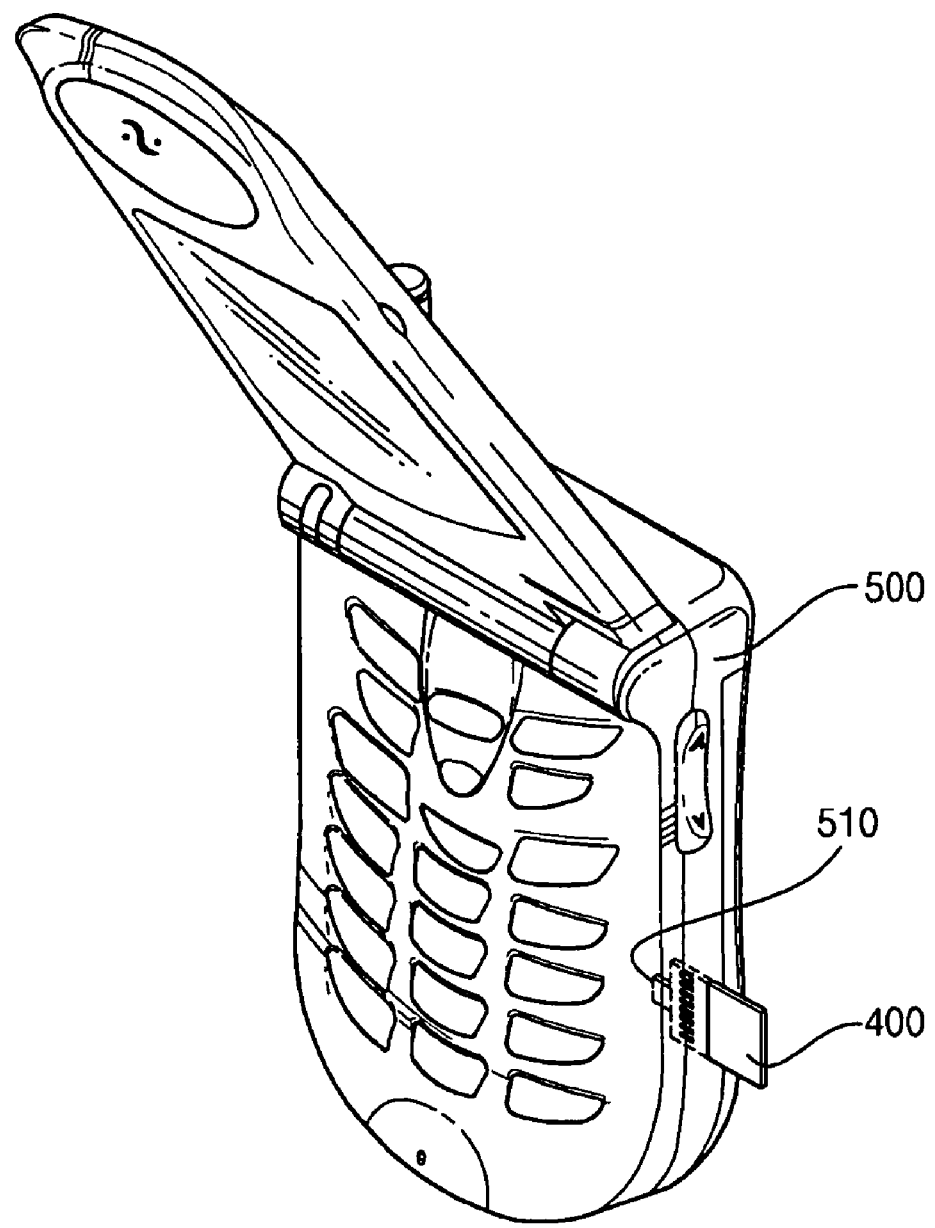

FIG. 22 illustrates a camera phone including a CIS chip in accordance with example embodiments. Referring to FIG. 22, a camera phone 500 may include a DSP 510 having a camera controller (not shown) and an image signal processor (not shown). The DSP 510 may be electrically connected to the CIS chip 400 illustrated with FIG. 21.

Figure 23:
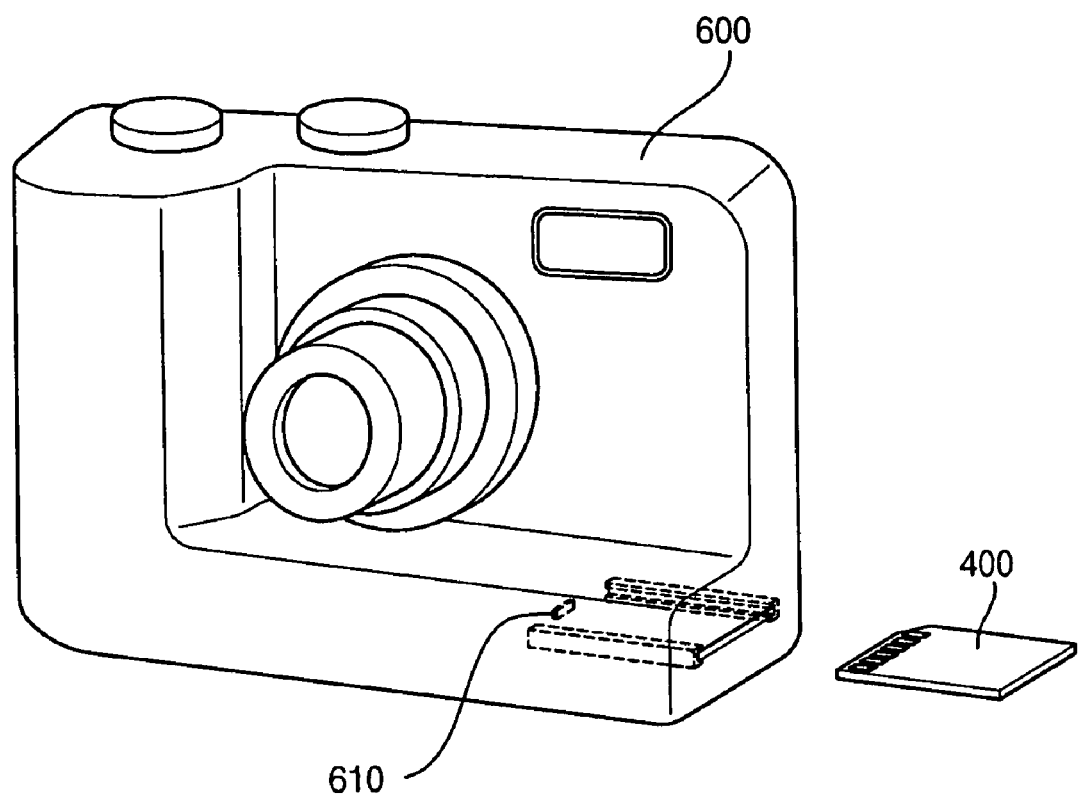

FIG. 23 illustrates a digital camera including a CIS chip in accordance with example embodiments. Referring to FIG. 22, a digital camera 600 may include a DSP 610 having a camera controller (not shown) and an image signal processor (not shown). The DSP 610 may be electrically connected to the CIS chip 400 illustrated with FIG. 21.

According to example embodiments, in a method of manufacturing a CIS having backside illumination (BSI) architecture, alignment among elements may be easily performed. Thus, the CIS may have improved sensitivity and improved electrical characteristics.

The foregoing is illustrative of example embodiments and is not to be construed as limiting thereof. Although a few example embodiments have been described, those skilled in the art will readily appreciate that many modifications may be possible in the example embodiments without materially departing from the novel teachings and advantages of example embodiments. Accordingly, all such modifications may be intended to be included within the scope of example embodiments as defined in the claims. In the claims, means-plus-function clauses may be intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, may be intended to be included within the scope of the appended claims.

What is claimed is:

1. A method of manufacturing a complementary metal-oxide semiconductor (CMOS) image sensor (CIS), the method comprising:
   forming an epitaxial layer on a first substrate including a chip area and a scribe lane area;
   forming a first impurity layer on the scribe lane area and adjacent to the first substrate by implanting first impurities into the epitaxial layer;
   forming a photodiode in the epitaxial layer on the chip area;
   forming a circuit element on the epitaxial layer, the circuit element being electrically connected to the photodiode;
   forming a protective layer on the epitaxial layer, the protective layer protecting the circuit element;

attaching a second substrate onto the protective layer;
removing the first substrate to expose the epitaxial layer;
forming a color filter layer on the exposed epitaxial layer using the first impurity layer as an alignment key; and
forming a microlens over the color filter layer.

2. The method of claim 1, wherein removing the first substrate to expose the epitaxial layer comprises exposing the first impurity layer.

3. The method of claim 2, wherein a portion of the first impurity layer is removed when the first substrate is removed.

4. The method of claim 1, wherein the epitaxial layer is lightly doped with impurities, and the first impurity layer is heavily doped with impurities.

5. The method of claim 1, after forming the first impurity layer, further comprising:
forming a second impurity layer on the first impurity layer by implanting second impurities into the epitaxial layer,
wherein the second impurity layer and the first impurity layer are used as an alignment key for the photodiode and the circuit element.

6. The method of claim 1, wherein forming the first impurity layer comprises:
forming a first isolation trench in the chip area of the epitaxial layer; and
forming an ion implantation region in the epitaxial layer by implanting ions into a portion of the epitaxial layer exposed by the first isolation trench.

7. The method of claim 6, further comprising:
forming a second isolation trench in the scribe lane area of the epitaxial layer,
wherein the first isolation trench is formed to have a depth deeper than that of the second isolation trench and a thickness greater than the thickness of the photodiode.

8. The method of claim 6, wherein the ions include oxygen ions or nitrogen ions.

9. The method of claim 1, wherein the epitaxial layer is formed to a thickness of about 5 to about 15 µm.

10. The method of claim 1, wherein forming the epitaxial layer further comprises:
forming first, second and third n-wells and first and second p-wells in the epitaxial layer on the chip area, wherein the first n-well is adjacent to or contacting the first substrate.

11. The method of claim 1, further comprising:
forming a gate insulation layer on the epitaxial layer;
forming a plurality of gate electrodes on the gate insulation layer;
forming source/drain regions adjacent to the plurality of gate electrodes in the epitaxial layer;
forming an insulating interlayer on the gate insulation layer configured to cover the plurality of gate electrodes; and
forming a plurality of metal wirings through or on the insulating interlayer, wherein the plurality of metal wirings are electrically connected to the source/drain regions.

12. The method of claim 1, wherein the first impurity layer directly contacts the first substrate.

13. The method of claim 1, wherein the protective layer surrounds an exposed upper surface and exposed sidewalls of the circuit element.

* * * * *